US008225683B2

(12) United States Patent
Bailey, III

(10) Patent No.: US 8,225,683 B2
(45) Date of Patent: Jul. 24, 2012

(54) WAFER BOW METROLOGY ARRANGEMENTS AND METHODS THEREOF

(75) Inventor: Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 707 days.

(21) Appl. No.: 12/233,501

(22) Filed: Sep. 18, 2008

(65) Prior Publication Data

US 2009/0084169 A1    Apr. 2, 2009

Related U.S. Application Data

(60) Provisional application No. 60/976,149, filed on Sep. 28, 2007.

(51) Int. Cl.
*G01B 21/20* (2006.01)
*H01L 21/66* (2006.01)

(52) U.S. Cl. ............. 73/865.8; 73/104; 438/14; 438/16; 438/17

(58) Field of Classification Search ................. 73/865.8, 73/104, 865.9; 438/14, 16–17, FOR. 142
See application file for complete search history.

(56) References Cited

U.S. PATENT DOCUMENTS

| 4,750,141 | A | 6/1988 | Judell et al. |
| 6,320,290 | B1 | 11/2001 | Kanebako et al. |
| 6,478,875 | B1 | 11/2002 | Sampath et al. |
| 6,975,960 | B2 * | 12/2005 | Kobayashi et al. ......... 438/14 X |
| 7,479,236 | B2 * | 1/2009 | Chen et al. ..................... 216/59 |
| 7,486,878 | B2 * | 2/2009 | Chen et al. .................. 438/14 X |
| 2005/0263484 | A1 * | 12/2005 | Park et al. ..................... 216/59 |
| 2009/0088887 | A1 * | 4/2009 | Chen et al. ................... 700/114 |

FOREIGN PATENT DOCUMENTS

| JP | 8166226 A | 6/1996 |
| JP | 2003202220 A | 7/2003 |
| KR | 2000-0019056 U | * 11/2000 |
| KR | 2001060748 A | * 7/2001 |
| KR | 1020010060748 A | 7/2001 |
| KR | 1020040037279 A | 5/2004 |
| KR | 2007028711 A | * 3/2007 |

OTHER PUBLICATIONS

"International Preliminary Report on Patentability", Issued in PCT Application No. PCT/US2008/078110; Mailing Date: Apr. 8, 2010.
"International Search Report", Issued in PCT Application No. PCT/US2008/078110; Mailing Date: May 28, 2009.
"Written Opinion", Issued in PCT Application No. PCT/US2008/078110; Mailing Date: May 28, 2009.
"Search Report", Singapore Patent Application No. 201002048-5, Mailing Date: Jul. 7, 2011.
"Examination Report", Singapore Patent Application No. 201002048-5, Mailing Date: Jul. 7, 2011.

* cited by examiner

*Primary Examiner* — Thomas P Noland
(74) *Attorney, Agent, or Firm* — Schwegman, Lundberg & Woessner, P.A.

(57) ABSTRACT

An arrangement for quantifying a wafer bow. The arrangement is positioned within a plasma processing system is provided. The arrangement includes a support mechanism for holding a wafer. The arrangement also includes a first set of sensors, which is configured to collect a first set of measurement data for a plurality of data points on the wafer. The first set of measurement data indicates a minimum gap between the first set of sensors and the wafer. The first set of sensors is positioned in a first location, which is outside of a set of process modules of the plasma processing system.

20 Claims, 14 Drawing Sheets

WAFER BOW METROLOGY ARRANGEMENTS AND METHODS THEREOF

PRIORITY CLAIM

This application is related to and claims priority under 35 U.S.C. §119(e) to a commonly assigned provisional patent application entitled "Wafer Bow Metrology Arrangements," by Andrew D. Bailey III, Application Ser. No. 60/976,149, filed on Sep. 28, 2007, which is incorporated by reference herein.

BACKGROUND OF THE INVENTION

Advances in plasma processing have facilitated growth in the semiconductor industry. Usually, a plurality of semiconductor devices may be created from dies cut from a single processed wafer (i.e., substrate). Since most recipes for processing the wafer assume that the wafer is planar, a non-planar wafer (e.g., a wafer with a bow) may cause variations that may result in defective semiconductor devices being created.

In an ideal situation, a wafer is perfectly planar. However, most wafers tend to have a slight bow and/or bump, thereby causing the wafer to be non-planar. The non-planarity of the wafer may be due to the original shape of the wafer and/or may be a result of the stress (e.g., mechanical stress) to the film that may have been deposited onto the wafer during one or more deposition steps. In some instances, if the wafer is too non-planar, the wafer may be considered unusable and may be discarded.

During certain processing steps, such as etching, knowing the configuration of the wafer may be important to accurately determine the amount of etching and to prevent the electrode within the processing chamber from accidentally touching the wafer, thereby causing damage to the wafer and/or damage to the electrode. This is especially true for processing chamber that may be sensitive to wafer bow. In an example, a bevel etcher may be especially sensitive to wafer bow since the upper electrode may come within very close proximity to the wafer in order to etch along the edge (e.g., bevel) of the wafer.

In a bevel etcher, the gap between an upper electrode and a wafer may be about 0.35 millimeters. However, the wafer bow may be as big as 0.25 millimeters. Thus, if the wafer bow is not correctly identified, the upper electrode may accidentally touch the wafer, thereby causing damages to the wafer and/or the upper electrode. In addition, since the amount of plasma that man, be introduced into the process module may also depend on knowing the actual gap, not being able to accurately identify the gap may cause variation in the processing.

Hence, before etching may be performed on the wafer, measurements may have to be performed to determine the extent of the wafer bow. However, in-line measurements are generally not taken during the deposition process. Thus, measurement data may not be available to be fed into the etching process in order to determine the extent of the wafer bow. Instead, stand-alone metrology, tools may be employed in order to determine the measurement of a wafer bow. However, the stand-alone metrology tools are usually employed for performing characterization measurement. In other words, each wafer is not measured to determine the wafer bow for the wafer. Instead, a sample may be taken to determine the type of wafer bow that may characterize a cluster of wafers. In addition, since the stand-alone metrology tools are not in-situ or even in-line, the measurements data are usually not in a format that enables the data to be easily fed forward to another tool, such as a bevel etcher.

A method that has been employed to enable in-situ measurements is to include a metrology tool within a process module in order to measure the wafer bow. In an example, measurements of the wafer bow may be taken while the wafer is sitting on an electrostatic chuck within a processing module, while waiting for the etching process to begin. One method of performing this measurement includes shining a beam of light across the wafer and measuring the level of light brightness as the upper electrode of the processing module is lowered to reduce the gap between the upper electrode and the wafer. The lowering of the upper electrode is stopped when a predetermined amount of light is no longer detected. At this point, the upper electrode is determined to be within close proximity to the wafer but not yet touching the wafer.

The purpose of identifying the point at which the upper electrode may be closed to touching the wafer is to determine the minimal distance between the electrode and the wafer, thereby identifying the height of the wafer. Unfortunately, the measurements that are taken are local to a single point. Thus, the measurements may not be the actual height of the wafer.

Consider the situation wherein, for example, the gap between an upper electrode and a wafer is 0.35 millimeters (as is common in a bevel etcher). Since processing may have to be performed within 0.1 millimeter of the wafer, being able to correctly identify the true height of the wafer may prevent the wafer and/or upper electrode from being damaged. In an example, if the true height of the wafer is 0.25 millimeters; however, the local measurements indicate that the height of the wafer is 0.20 millimeters. Since the processing steps require 0.1 millimeter (in this example) to perform the processing, but the upper electrode is actually 0.05 millimeters from the wafer, the wafer may inadvertently cause the wafer to be etched too deeply, which may cause a bad semiconductor devices to be created.

To facilitate discussion. FIGS. 1A, 1B, and 1C show examples of configurations of a non-planar wafer. FIG. 1A shows a wafer 100 with a bowl shape in which an edge 102 may have a higher height than a center 104. FIG. 1B shows a wafer 110 with a dome shape in which an edge 112 has a lower height than a center 114. FIG. 1C shows a wafer 120 with a wavy shape, like a potato chip, for example, in which the height at each point on wafer 120 may vary.

As can be seen from FIGS. 1A, 1B, and 1C, different configurations may exist for a wafer. Thus, taking measurements at a single point may not be sufficient to determine the true minimal distance between the electrode and the wafer. Even if more than a single point of measurement is taken, the tendency is to measure toward the center of the wafer. However, as can be seen from the figures, the true height may vary depending upon the configuration of the wafer. However, since the measurements are being performed as part of the processing steps, there is usually not sufficient time to take a sufficient sample to determine the true height of the wafer without negatively impacting the total processing time.

In addition, the prior art method does not provide for identifying the thickness of the wafer. In other words, some wafer may be of substandard quality and therefore may be thinner than the traditional thickness of about 0.77 millimeters. Since, the thickness can not be determined with a single point of measurement, the true gap between the upper electrode and the wafer may not be accurately determined. As a result, variation may occur in processing that may result in a defective product.

BRIEF SUMMARY OF THE INVENTION

The invention relates, in an embodiment, to an arrangement for quantifying a wafer bow. The arrangement is positioned within a plasma processing system. The arrangement includes a support mechanism for holding a wafer. The arrangement also includes a first set of sensors, which is configured to collect a first set of measurement data for a plurality % of data points on the wafer. The first set of measurement data indicates a minimum gap between the first set of sensors and the wafer. The first set of sensors is positioned in a first location, which is outside of a set of process modules of the plasma processing system.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE SEVERAL VIEWS OF THE DRAWINGS

The present invention is illustrated by was of example, and not by way of limitation, in the figures of the accompanying drawings and in which like reference numerals refer to similar elements and in which.

DETAILED DESCRIPTION OF EMBODIMENTS

Figure 1A:
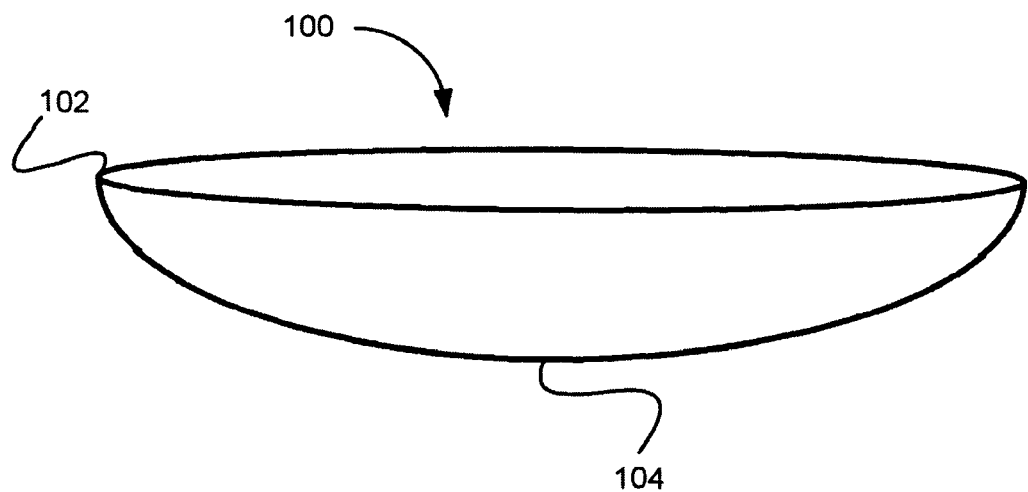
FIGS. 1A, 1B, and 1C show examples of configurations of a non-planar wafer.
Figure 1B:
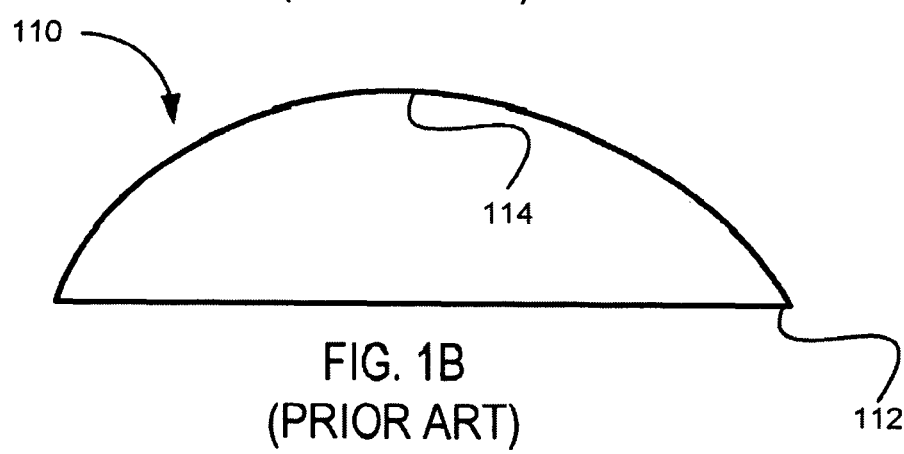
Figure 1C:
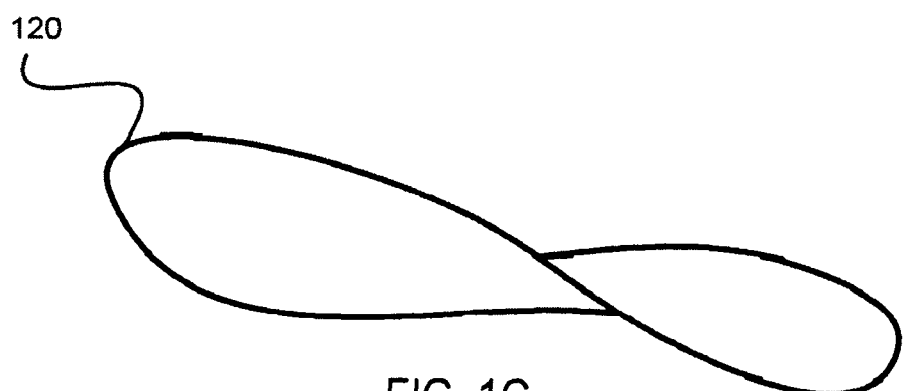

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Those skilled in the art are aware that once a wafer is within a processing module, a plurality of steps may be performed in order to prepare and stabilize the processing module in order to set up the proper condition and environment before the actual processing may begin. Thus, considerable amount of time and resources are dedicated to the preparation of the processing module to create the right processing environment.

In the prior art, when a wafer is being measured, there is a possibility that a wafer may be identified as being a "bad" wafer if the wafer has a configuration that may be too non-planar. If such a "bad" wafer is identified, the wafer is usually discarded and replaced by another wafer. Unfortunately, by the time a "bad" wafer is identified, a significant amount of time and resources may have already been spent prepping the processing module.

In one aspect of the invention, the inventor herein realizes that additional time and resources are being unnecessarily added to total processing time. Instead, if the measurements are performed outside of the processing module but within the plasma processing system, such as within an aligner, for example, the wafer may be measured without increasing the total processing time. Accordingly, measurements may be taken for one wafer while another wafer is being processed.

In accordance with embodiments of the invention, a wafer bow metrology arrangement is provided for quantifying a wafer bow. Embodiments of the invention include one or more locations for implementing the wafer bow metrology arrangement. Embodiments of the invention also include different configurations for the wafer how metrology arrangement.

In an embodiment of the invention, a wafer bow metrology arrangement may be implemented in a location outside of the process module. As aforementioned, the measurement of the wafer bow inside the process module may cause total processing time to be increased. In the semiconductor industry, reducing processing time in order to increase throughput provides a company a competitive edge over its competitors. With the wafer bow metrology arrangement, the wafer bow metrology arrangement may be placed within the plasma processing system, allowing for in-line measurements, without adding to the actual processing time.

To measure the movements, the wafer bow metrology arrangement may include sensors, which may be strategically placed to capture wafer movements. In an example, the wafer bow metrology arrangement may be placed near the entrance into the atmospheric transfer module (ATM). For example, the wafer bow metrology arrangement may measure a wafer as the wafer is being transferred by a robot from a front opening unified pod (FOUP) into the ATM. Similarly, the wafer bow metrology arrangement may be placed at the entrance for the other modules, such as the entrance into an aligner, at the entrance into the airlock modules, at the entrance into the vacuum transfer module (VTM), and the like. As can be appreciated from the foregoing, the proximity of the location to the FOUP provides the benefit of being able to quickly move the wafer in or out of the plasma processing system. Based on this criterion, the entrance to the ATM has a strategic advantage over the entrance to the VTM.

In an embodiment, a wafer bow metrology arrangement may be placed within the aligner. Those skilled in the art are aware that the aligner is configured to center a wafer before the wafer is moved into a process module. In order for the aligner to perform its task, the aligner may at least include an electrostatic chuck upon which a wafer may be positioned and a set of sensors for performing in-line metrology. Thus, incorporating the wader bow metrology arrangement into the aligner may require minimal modification to the aligner, such as inserting at least one additional sensor for gathering the necessary measurement data.

As can be appreciated from the foregoing, a plurality of locations within a plasma processing system may be available for placing a wafer bow metrology arrangement. Each location has the distinct advantage over the prior art arrangement in that performing in-line metrology in any of these locations has significantly less impact on total process time. In other words, additional time has not been added to the total process time in order to enable measurements to be performed. Also, precious time in prepping the process module is not lost if a wafer is determined to be "bad" and has to be removed from the process module. Further, since measurements are being taken while the wafer is being situated outside of a process module, more time may be allotted to the measurement process, thereby enabling more measurement data to be gathered.

In an embodiment, a wafer bow metrology arrangement is a flexible arrangement that allows for different configurations to accommodate the diverse locations in which the wafer bow metrology arrangement may be placed. In an embodiment, the wafer bow metrology arrangement may include a set of sensors for performing in-line metrology. The set of sensors may be configured to take measurements of a wafer as the wafer is moved through the plasma processing system. In an embodiment, the set of sensors may include but are not limited to a set of contact sensors, a set of capacitive sensors, a set of inductive sensors, a set of laser sensors, a set of ultra sonic sensors, a set of reflective sensors, a set of beam sensors, and the like.

In the prior art, due to time limitation and more spatial constraints in the processing module, measurements may be taken at one or two points on the wafer. Unlike the prior art, measurements are taken at a plurality of points, thereby providing a more accurate picture of the wafer bow. Although one sensor may be sufficient to collect enough measurement data to determine the bow of a wafer, a wafer bow metrology arrangement with more sensors may be able to take more sample measurements, thereby providing a more accurate picture of the configuration of the wafer. Thus, the number of sensors that may be included in the wafer bow metrology arrangement may, be limited only by physical limitation (e.g., space allocation) and a manufacture's discretion based on the benefit derived from an additional sensor in comparison to the additional cost.

In the prior art, a wafer bow may be determined; however, the prior art method does not account for the thickness of a wafer. Those skilled in the art are aware that not all wafers have the same thickness. By knowing the thickness of the wafer, the recipe may be adjusted to account for the thickness difference. In an example, a recipe may be designed for etching a standard wafer (which is usually about 0.77 millimeters thick). However, a wafer thickness may deviate from standard. In an example, some wafers may only be about 0.55 millimeters thick. Thus, the recipe that may be designed to etch a standard wafer ray create defective semiconductor devices if the recipe is not adjusted when the recipe is being applied to a thinner wafer.

In an embodiment, a second set of sensors may be placed opposite of the first set of sensors (i.e., one set of sensors is located above die wafer and one set of set sensors is placed below the wafer). The second set of sensors may be configured to collect additional measurement data at the same locations as the first set of sensors. With the two set of measurements from the first and second sets of sensors, the thickness of a wafer may be determined.

The features and advantages of the present invention may be better understood with reference to the figures and discussions that follow.

Figure 2:
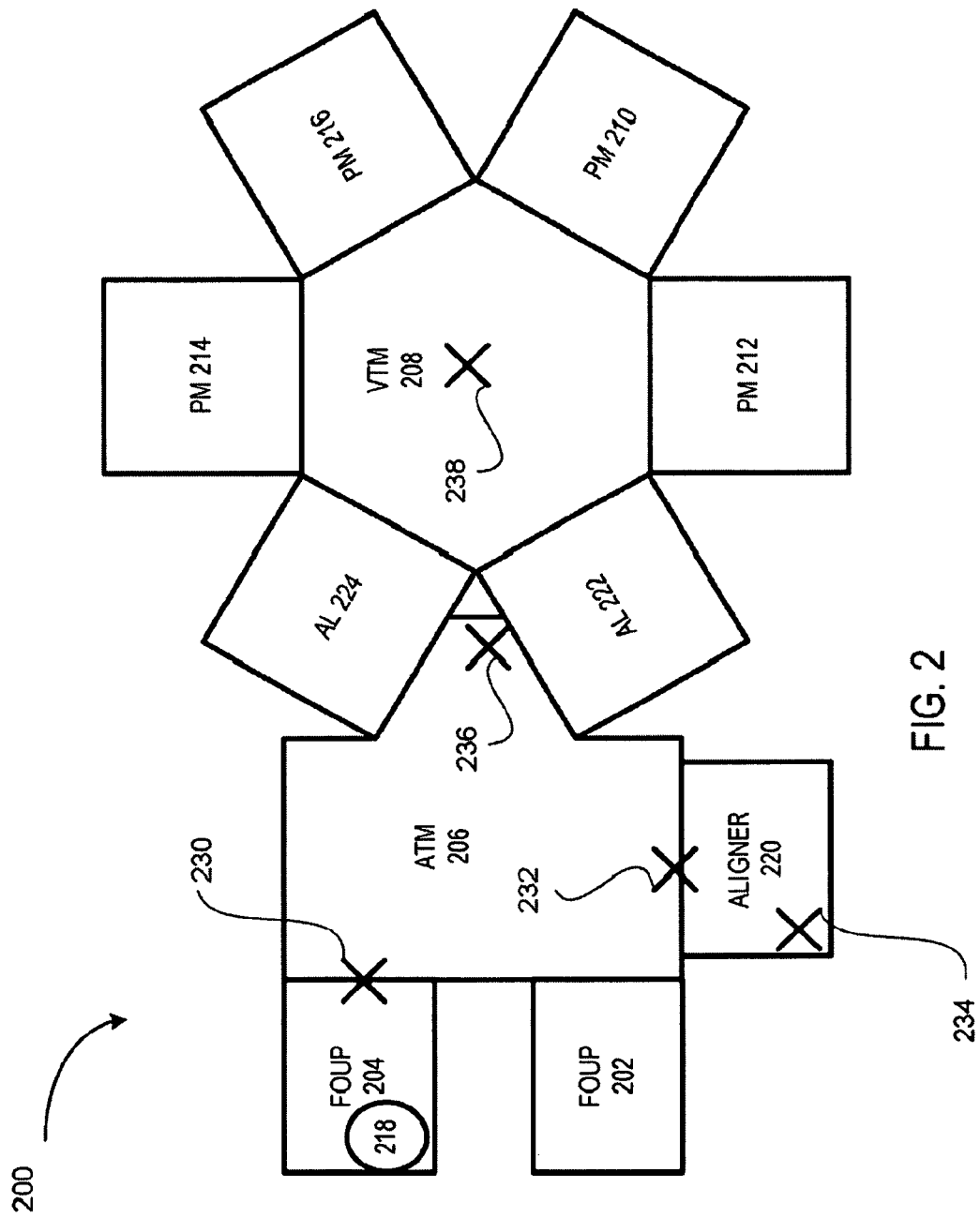
FIG. 2 shows, in an embodiment of the invention, a simple block diagram illustrating examples of different locations within a plasma processing system (e.g., bevel etcher) that a wafer bow metrology arrangement may be implemented.

FIG. 2 shows, in an embodiment of the invention, a simple block diagram illustrating examples of different locations within a plasma processing system (e.g., bevel etcher) that a water bow metrology arrangement may be implemented. A plasma processing system 200 may include a plurality of substrate-holding locations, such as front opening unified pods (FOUPs) 202 and 204, in which wafers may be placed before being moved into plasma processing system 200 for processing.

Consider the situation wherein, for example, a cluster of wafers has being stacked in FOUP 204. Traditionally, a robotic arm within an atmospheric transfer module (ATM) 206 may move a wafer 218 from FOUP 204 through ATM 206 to an aligner 220. Once the aligner has at least centered wafer 218, the robotic arm may, move wafer 218 from aligner 220 through ATM 206 to one of the airlock modules (AL 222 and AL 224). The ability of the airlock modules to match the environment between ATM 206 and a vacuum transfer module VTM 208 allows wafer 218 to move between the two pressurized environments without being damaged. From an airlock module, such as AL 222, wafer 218 may be moved into one of the process modules (210, 212, 214, and 216) by a second robotic arm within VTM 208.

In the prior art, the measurements for determining the wafer bow is performed in one of the process modules. As can be seen from the figure, wafer 218 may be transferred through a plurality of modules before arriving at one of the process modules. If wafer 218 is deemed to be a "bad" wafer, wafer 218 may have to be transferred back out through all the other modules. As can be appreciated from the foregoing, the total overall processing time may be unnecessarily increased not only due to the time required to measure the wafer bow while wafer 218 is inside one of the process modules, but also due to the time required to remove a wafer when the wafer is deemed "bad".

In an embodiment of the invention, a wafer bow metrology arrangement may be physically placed outside of the process modules, thereby enabling wafer processing to occur while measurements are being performed. In other words, parallel processing may occur with a first wafer being processed within a process module while the wafer bow metrology arrangement may measure the wafer bow for another wafer. With parallel processing, in-line metrology may occur without unnecessarily adding to the total overall process time. Also, if the wafer is deemed "bad", an inordinate amount of time has not been wasted since the measurements are being performed outside of the process module.

As aforementioned, the possible locations a wafer bow metrology arrangement may be outside of one of the process modules may vary. In an embodiment, a wafer bow metrology arrangement may be placed closed to the entrance of ATM 206 (i.e., at a location 230). By placing the wafer bow metrology arrangement at location 230, measurements may be taken as the wafer, such as wafer 218, is first being moved into plasma processing system 200 from FOUP 202 or FOUP 204. Thus, if the measurement data identified the wafer, such as wafer 218, as being a "bad" wafer, very little time and resources may have been wasted since the wafer is still close to the entrance of plasma processing system 200.

A wafer bow metrology arrangement many also be placed closed to the entrance of aligner 220 (i.e., at a location 232), in an embodiment. Similar to location 230, location 232 is still closed to the entrance of plasma processing system 200, thereby minimizing the amount of time and resources that may have been spent processing the wafer, such as wafer 218, if the wafer is identified as "bad".

In yet another embodiment, a wafer bow metrology arrangement may be placed inside aligner 220 (i.e., at a location 234). In addition to being closed to the entrance of plasma processing system 200, location 234 may also provide the benefit of already having existing components, such as a wafer-supported chuck and metrology tool, to perform the measurements. Thus, minimal modification to aligner 220 may have to happen to enable the measurements of the wafer bow to occur. Discussion about the wafer bow metrology arrangement will be provided in upcoming figures.

Other possible locations for placing a wafer bow metrology arrangement may include placing the arrangement close to the entrance of the airlock modules (i.e., at location 236) or within VTM 208 (location 238). The locations that have been mentioned are only examples of the various different locations that a wafer how arrangement many be placed. As can be appreciated from the foregoing, the closer the wafer bow metrology arrangement is placed to the entrance of plasma processing system 200, the amount of time and resources that may be wasted if a wafer is deemed "bad" may be minimized. Also, the throughput per minute for processing may be maximized since wafer processing is not negatively impacted when a "bad" wafer is identified and/or time is not needed to be allotted from overall processing time in order to perform the measurement of the wafer bow.

As aforementioned, the wafer bow metrology arrangement may be implemented in different locations. Since the wafer bow metrology arrangement is implemented outside of the process modules, more time may be allotted for performing the measurements of wafer bow in order to collect better measurement data that may provide a better indication of the true minimal distance between the upper electrode and the wafer. In an embodiment, a wafer may be of different configurations in order to accommodate the different locations. The next few figures will provide examples of configurations that may, be implemented. To facilitate discussion, the next few figures will be discussed with the wafer bow metrology arrangement being positioned within aligner 220.

Figure 3A:
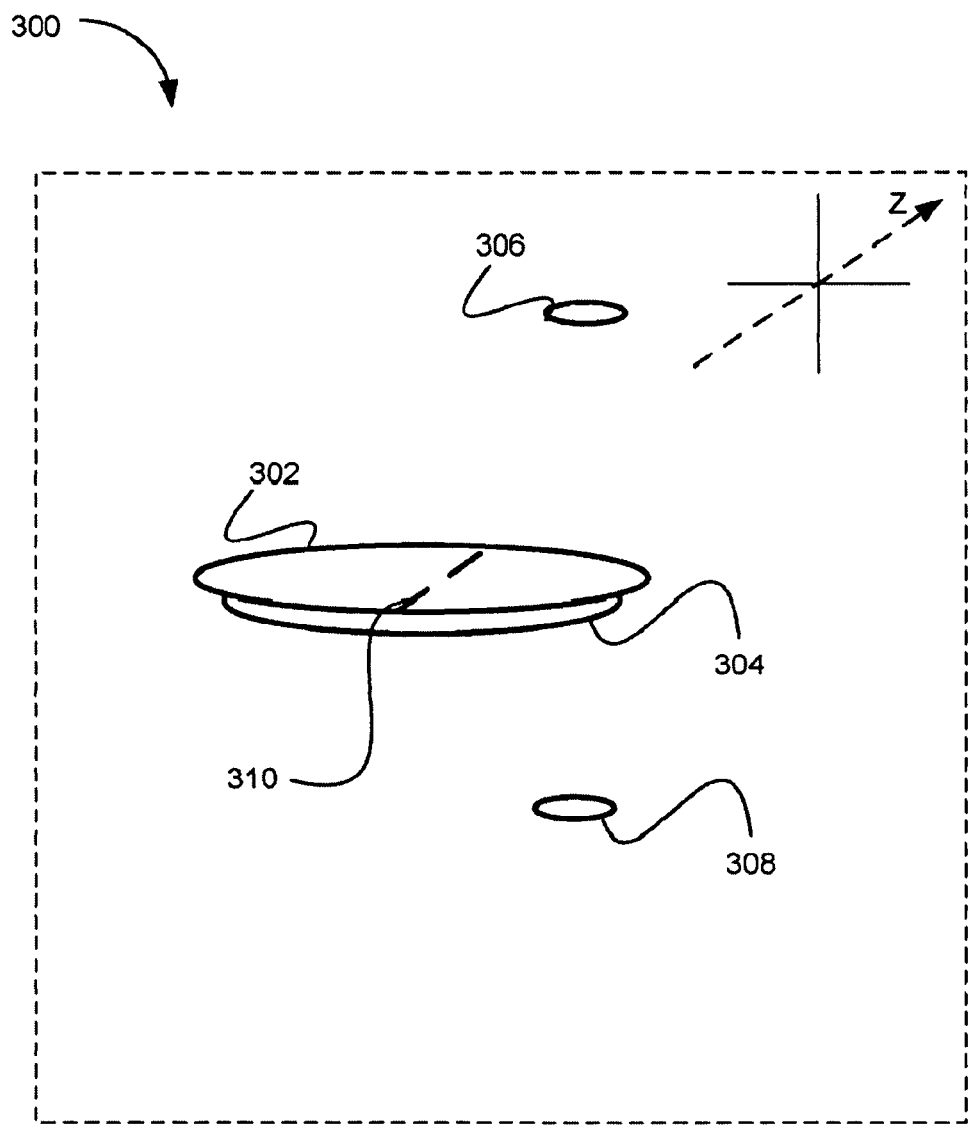
FIG. 3A shows, in an embodiment of the invention, a simple block diagram of a wafer bow metrology arrangement with a single fixed sensor.

FIG. 3A shows, in an embodiment of the invention, a simple block diagram of a wafer bow metrology arrangement 300 with a single fixed sensor. Consider the situation wherein, for example, a wafer 302 is positioned within an aligner on top of an electrostatic chuck 304. A wafer bow metrology arrangement 300 may include a sensor 306 positioned above wafer 302. In an embodiment, sensor 306 may be a metrology tool capable of determining the distance between two objects, such as the wafer and the sensor. Examples of sensor 306 may include, but are not limited to, contact sensor, capacitive sensor, inductive sensor, laser sensor, ultra sonic sensor, reflective sensor, through beam sensor, and the like. In this configuration, sensor 306 is stationary while wafer 302 is being moved, thereby enabling an array of points to be measured. In an embodiment, the wafer is moving in a z direction, thereby enabling a measurement data to be collected along different points of the same line. Since a plurality of measurements is being taken at different points on the wafer (e.g., 310), the true minimal distance from the surface may be derived from the set of measurements, instead of just being a local minimal for a single point (as typical of the prior art).

In addition, wafer bow metrology arrangement 300 may include a second sensor 308 placed beneath wafer 302. Measurements taken by sensor 308 may be taken along the same line and at the same points as sensor 306. As can be appreciated from the foregoing, second sensor 308 is not required to take measurements at each point that sensor 306 may have taken in order to determine the thickness of wafer 302.

To determine the thickness of the wafer, measurements taken by the two sensors are added and the total is subtracted from the actual distance between the two sensors. In an example, assume that the distance between sensor 306 and wafer 302 is 0.38 millimeters and the distance between sensor 308 and wafer 302 is 0.35 millimeters. Since the distance between each sensor is known (assume in this example, the distance between sensors 306 and 308 is 1.43 millimeters), the thickness of the wafer may be determined by subtracting the total distance from the sensor to the wafer for both sensors from the actual distance between the two sensors. Thus, the thickness of the wafer from this example is (1.43−(0.38+0.35))=0.70 millimeters.

Figure 3B:
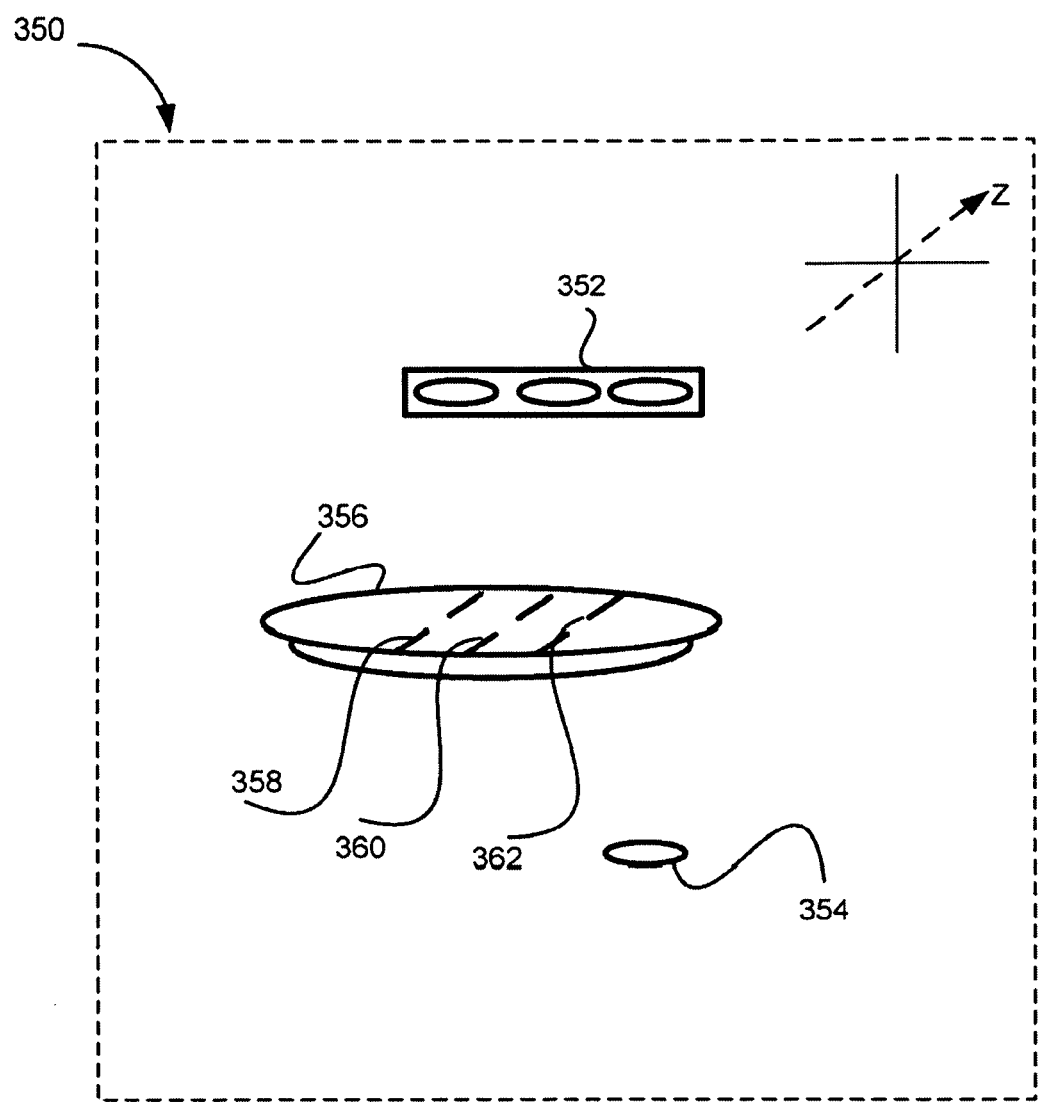
FIG. 3B shows, in an embodiment of the invention, a simple block diagram of a wafer bow metrology arrangement with an array of fixed sensors.

FIG. 3B shows, in an embodiment of the invention, a simple block diagram of a wafer bow metrology arrangement 350 with an array of fixed sensors 352. Wafer bow metrology arrangement 350 is similar to wafer bow metrology arrangement 300 in that measurements for a plurality of points may be taken along a single line. However, by having array of sensors 352, measurements along more than one line (such as lines 358, 360 and 362) may be taken. As aforementioned, the number of sensors that may be implemented within a wafer bow metrology arrangement may vary depending upon a manufacturer's discretion. Although a single sensor may be sufficient to determine the bow of a wafer 356, a manufacturer ma) want to include additional sensors if the manufacturer determines that the additional measurement data may be needed in order to provide a better understanding of the configuration of the wafer. Similar to FIG. 3A, a set of sensors 354 may be placed beneath the wafer. As can be appreciated from the foregoing, one or more sensors may be placed beneath the wafer to collect the measurements that may determine the thickness of the wafer.

Figure 4A:
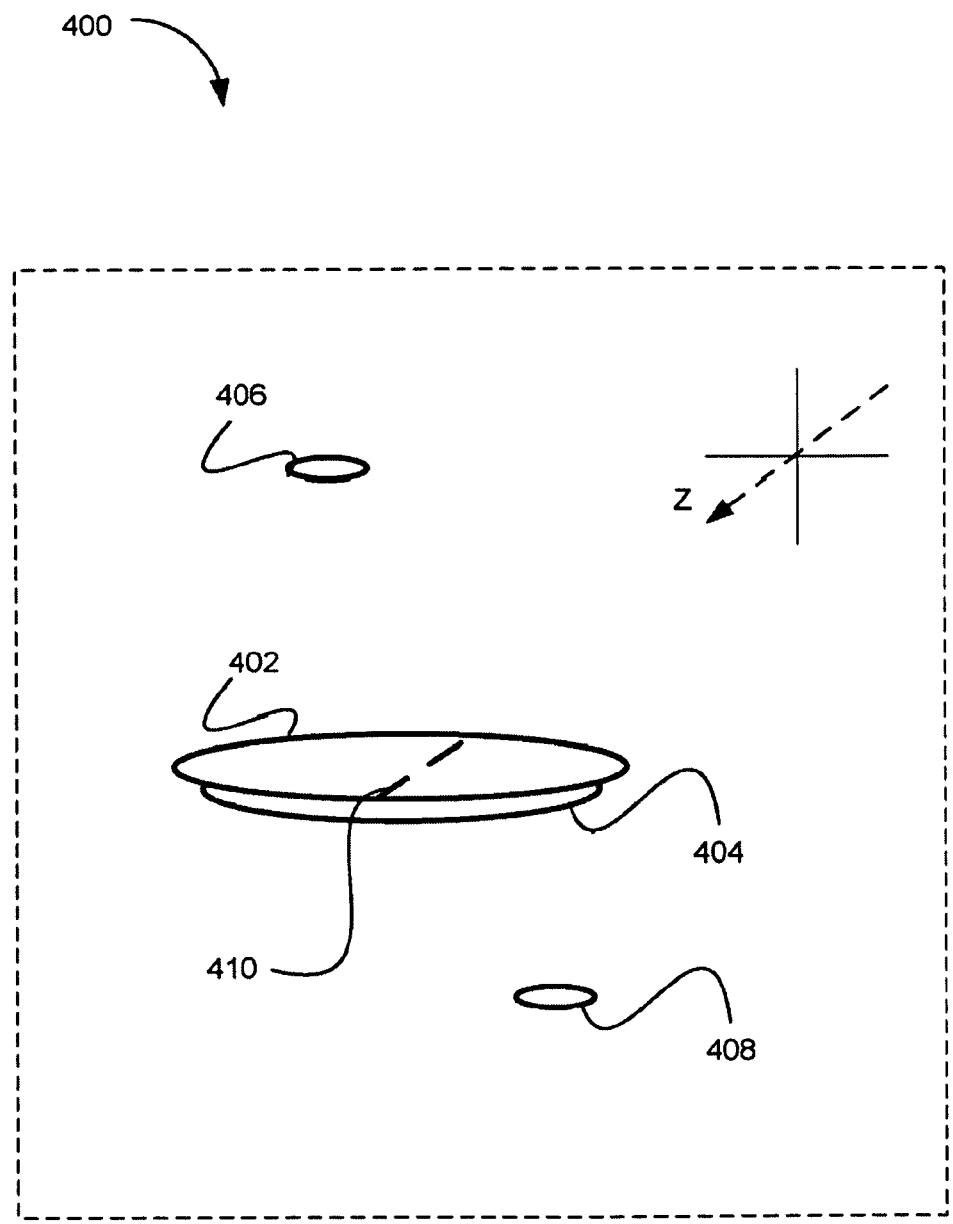
FIG. 4A shows, in an embodiment of the invention, a simple block diagram of a wafer bow metrology arrangement with a moving sensor.

FIG. 4A shows, in an embodiment of the invention, a simple block diagram of a wafer bow metrology arrangement 400 with a moving sensor. Consider the situation wherein, for example, a wafer 402 is positioned on top of an electrostatic chuck 404. Wafer bow metrology arrangement 400 may include a sensor 406 positioned above wafer 402. In this configuration, sensor 406 is moving in a z direction while wafer 402 is stationary. This configuration may be employed in locations in which a wafer may be at rest. Again, since a plurality of measurements is being collected at different points along the same line (410) on the wafer, the minimal that may be determined is not local to a specific point and may be a more accurate minimal of the wafer.

Figure 4B:
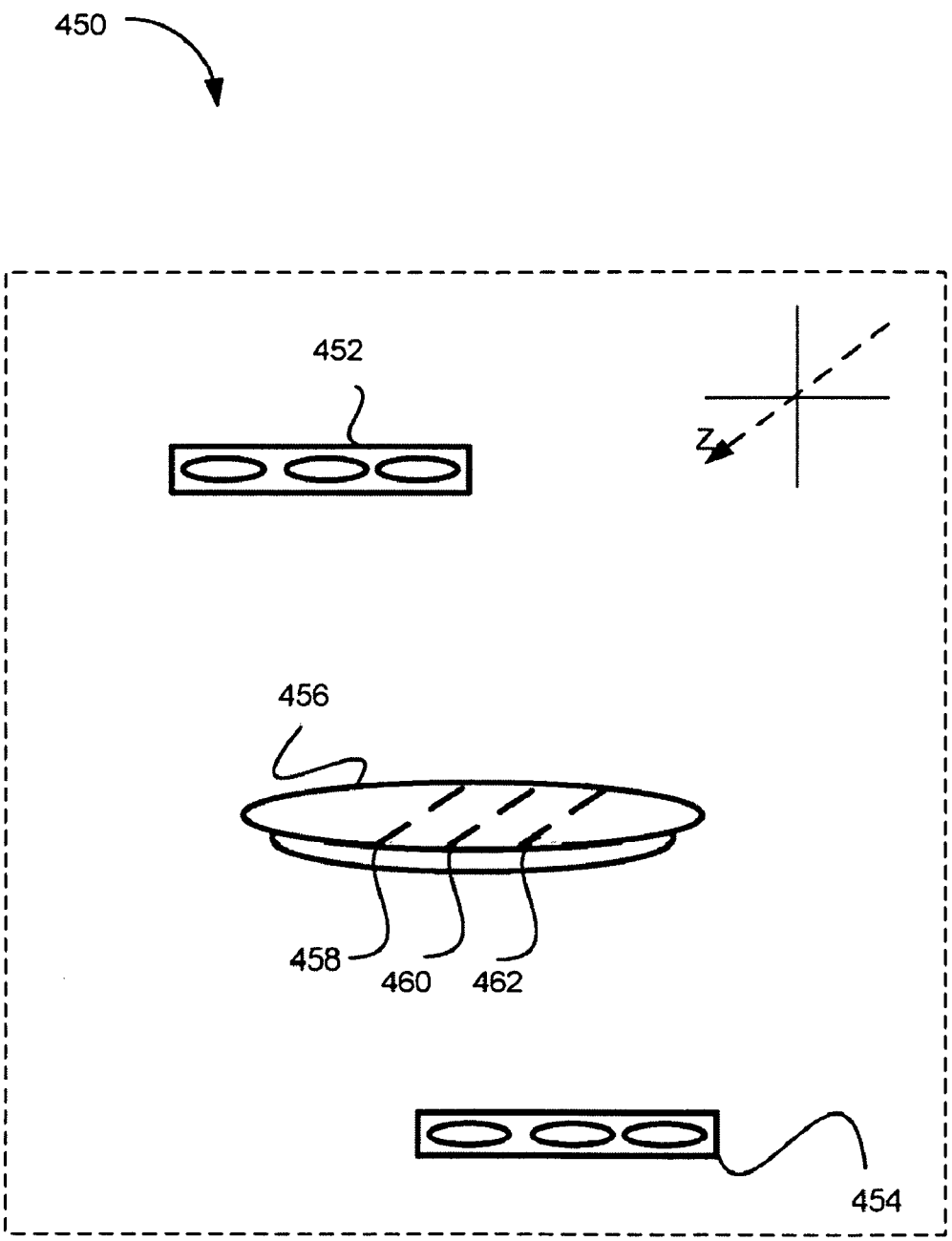
FIG. 4B shows in an embodiment of the invention, a simple block diagram of a wafer bow metrology arrangement locations with an array of sensors.

Similar to FIG. 3B above, FIG. 4B shows in an embodiment of the invention, a simple block diagram of a wafer bow metrology arrangement locations 450 with an array of sensors 452. Wafer bow metrology arrangement 450 is similar to wafer bow metrology arrangement 400 in that measurements along a plurality of points may be taken as array of sensors 452 is being moved across a wafer 456. However, with an array of sensors, more than one set of measurements (such as 458, 460, and 462) may be taken at one time. Thus, more measurement data may be available to determine the true minimal of the wafer.

Both FIGS. 4A and 4B may, in an embodiment of the invention, include a second set of sensors (408 and 454, respectively) positioned beneath the wafer. Second set of sensors (408 and 454) may collect measurement data from the same locations as the first set of sensors (406 and 452, respectively) to determine the thickness of the wafer. As aforementioned, measurements taken by the second set of sensors may be limited to a single point; instead of all points on the wafer in which measurements may have been collected by the first set of sensors. Similar to the above figures, the thickness of the wafer ma, be determined by subtracting the total distance of the sensor to the wafer and subtracting the total from the actual distance between the two sensors.

Figure 5A:
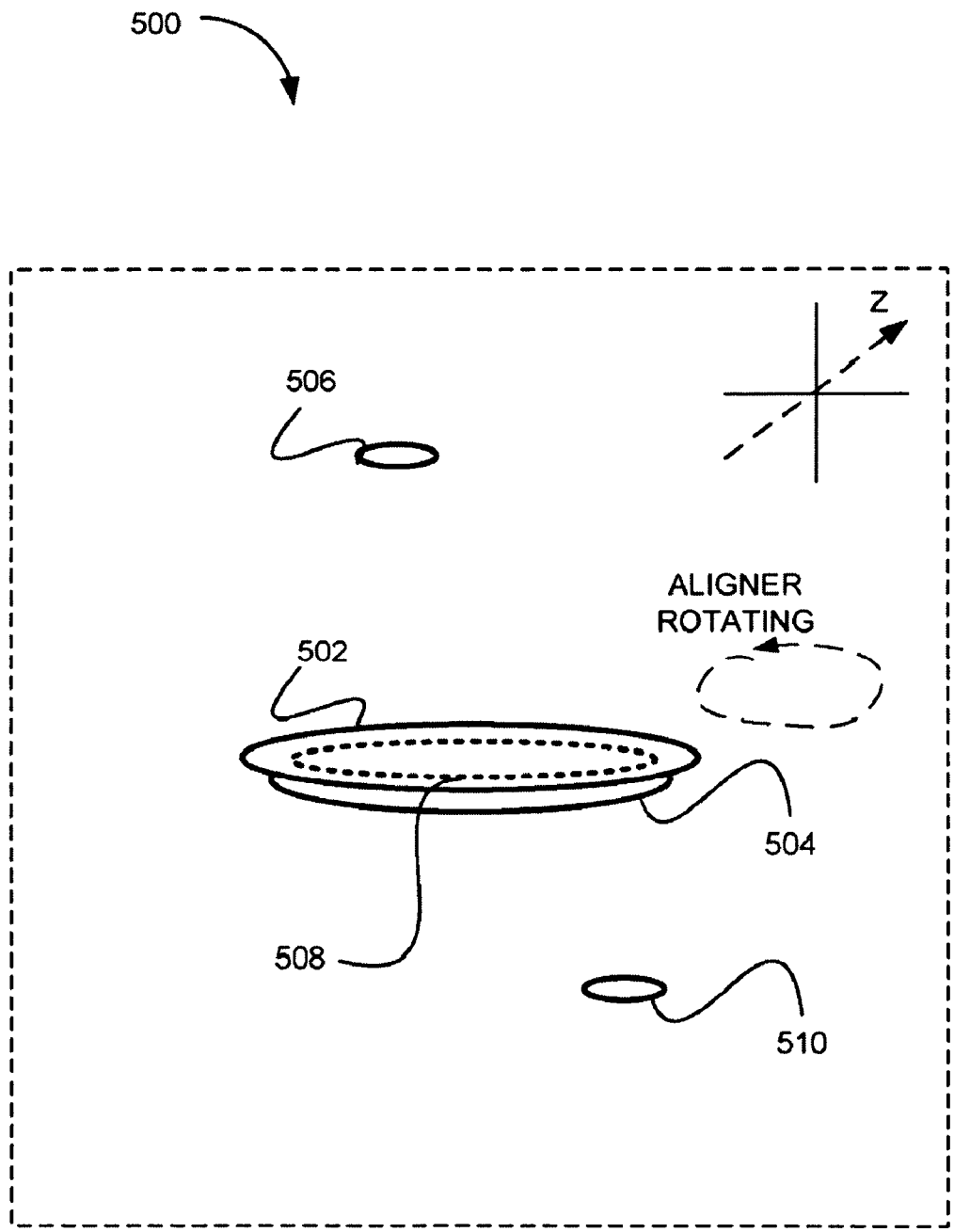
FIG. 5A shows, in an embodiment of the invention, a wafer bow metrology arrangement with a fixed sensor and a rotating wafer.
Figure 6A:
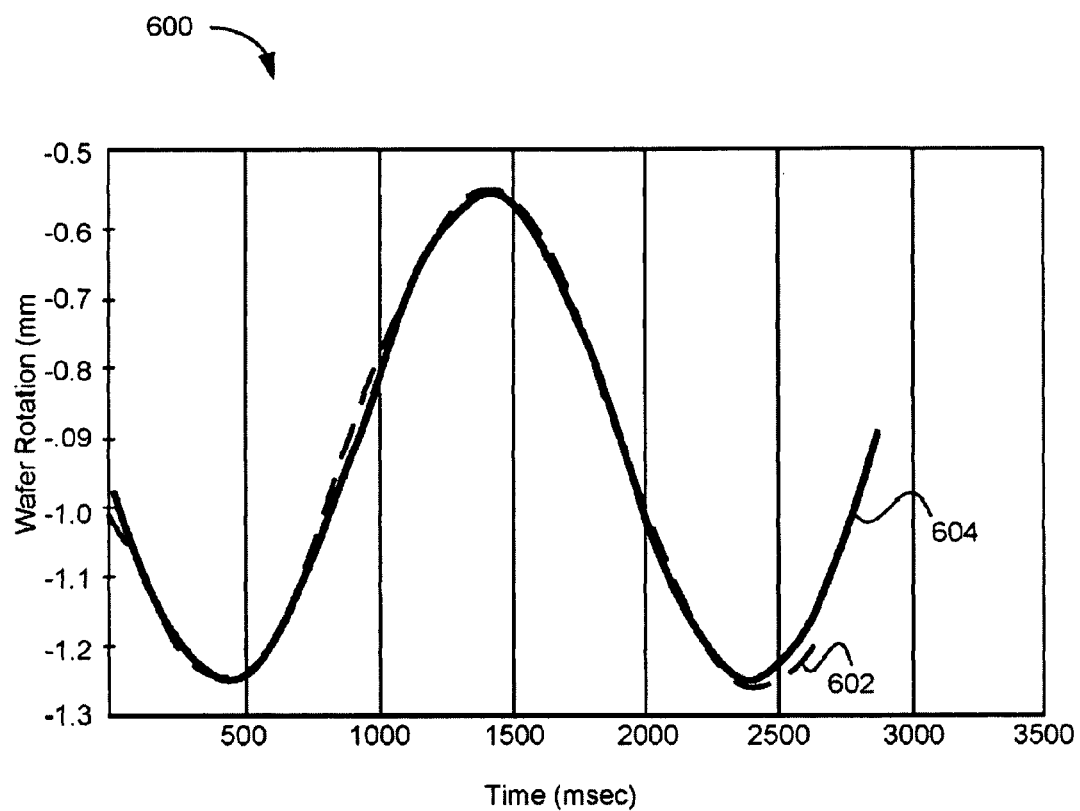
FIG. 6A shows, in an embodiment of the invention, a sinusoidal curve.
Figure 6B:
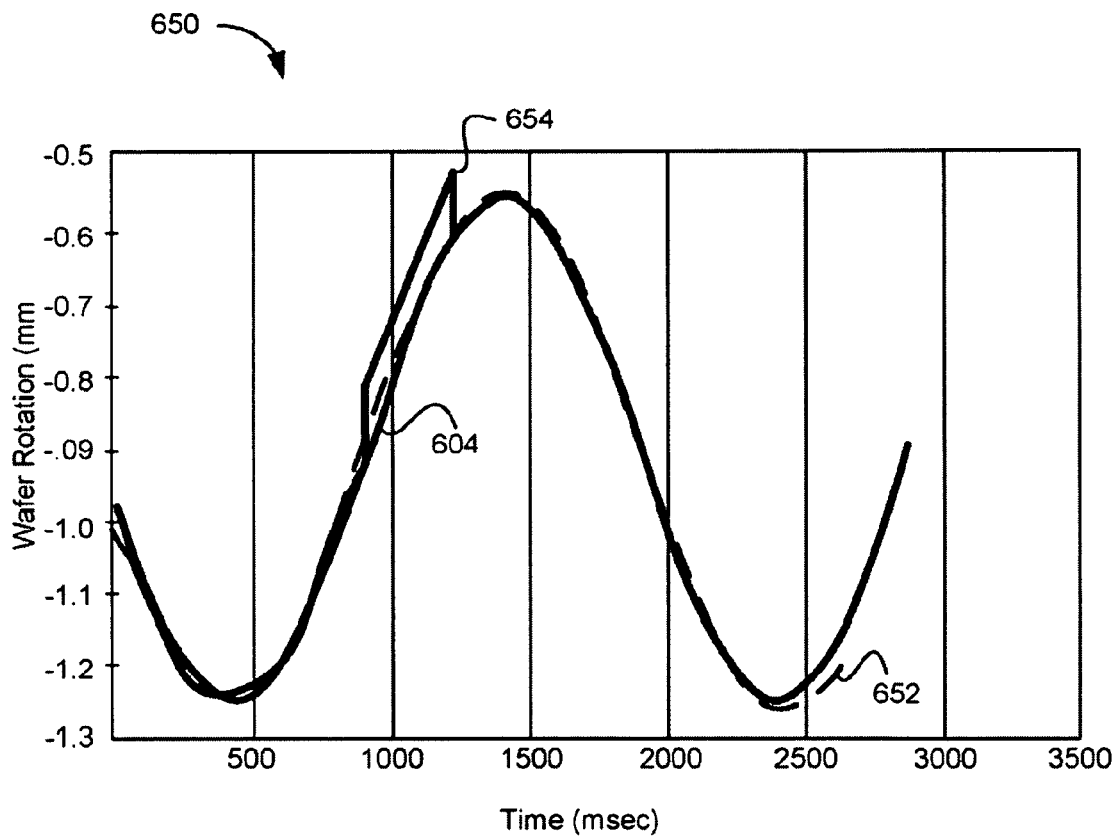
FIG. 6B shows, in an embodiment of the invention, a sinusoidal curve with a perturbation.

FIG. 5A shows, in an embodiment of the invention, a wafer bow metrology arrangement 500 with a fixed sensor 506 and a rotating wafer 502. Consider the situation wherein; for example, wafer 502 is positioned within an aligner on top of an electrostatic chuck 504. While the aligner is rotating, a plurality of measurements may be taken in a circular direction (508). Those skilled in the art are aware that while an aligner is rotating, the aligner may experience a wobbly effect. Thus, the first order of bow may be the wobbly effect of the aligner and may be graphically shown as a sinusoidal curve. In an example, FIG. 6A shows, in an embodiment, an example of a graph 600 in which a wafer wobble 602 may be curve-fit into a sinusoidal curve 604. Note that the graph is wafer position vs. time. However, time may be translated into theta since rotational velocity of the aligner can easily be measured and be verified on most aligner with the period of the notch detection. In other words, if the measurements in the z direction as a function of theta is plotted and produced a sinusoidal curve, then wafer 502 may be considered as planar since the curve is due to the rotational effect of the aligner. However, if the sinusoidal curve shows a perturbation (e.g., a bump), then a bow may exist on the wafer. In an example, FIG. 6B shows, in an embodiment, an example of a graph 650 in which the measurement indicates a perturbation 654 in comparison to a sinusoidal curve 652.

Figure 5B:
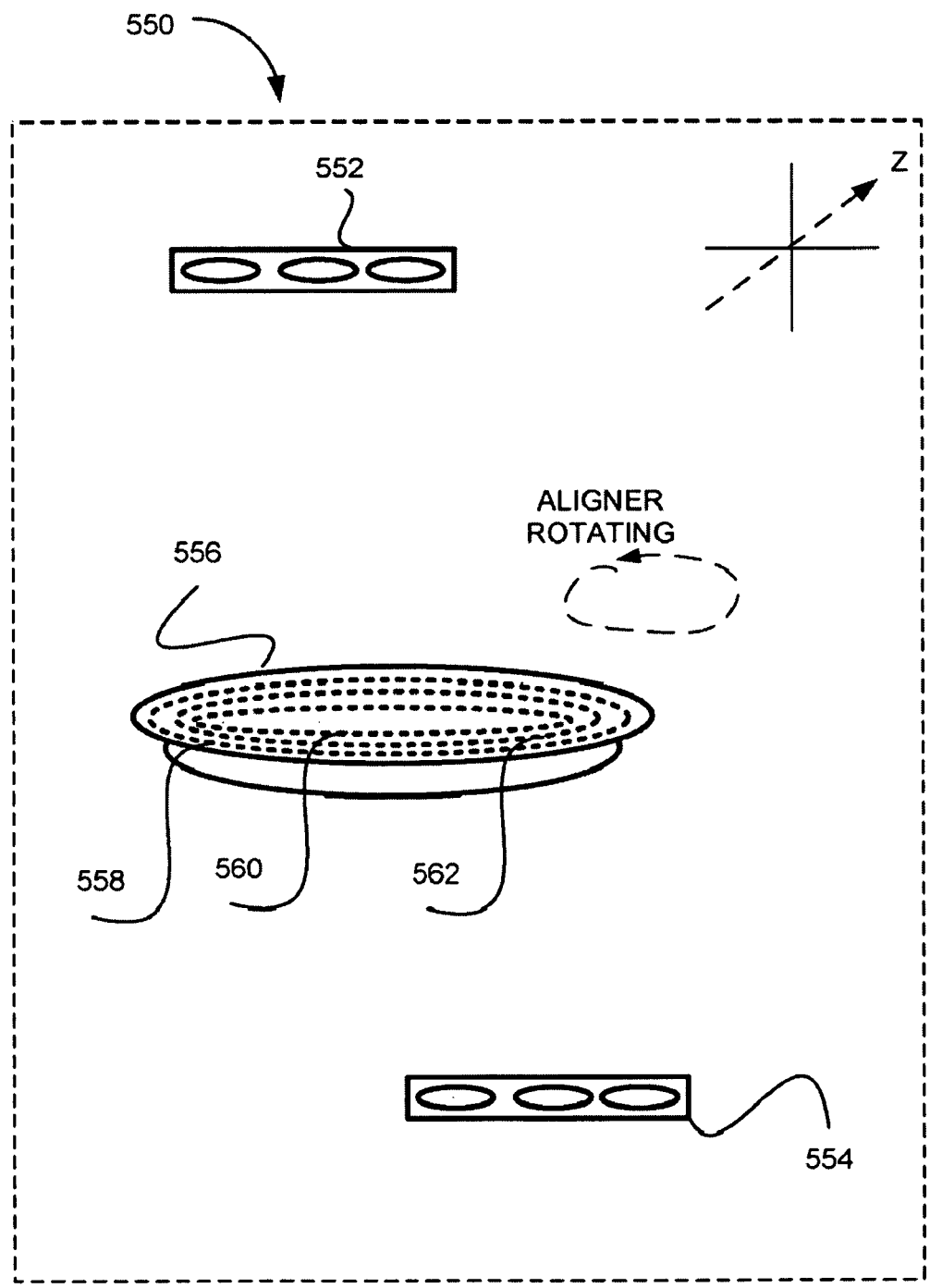
FIG. 5B shows, in an embodiment of the invention, a wafer bow metrology arrangement with an array of fixed sensors and a wafer that may be rotating.

FIG. 5B shows, in an embodiment of the invention, a wafer box metrology arrangement 550 with an array of fixed sensors and a wafer 556 that may be rotating. Wafer bow metrology arrangement 550 is similar to wafer bow metrology arrangement 500 in that measurements along a plurality of points may be taken in a circular direction. However, by having array of sensors 552, measurements along more than one circumference (such as circumferences 558, 560, and 562) may be collected. Thus, more measurement data may be available to determine the true minimal of the wafer. Thus, with a plurality of measurements, a topography graph may be produced for the wafer to provide a better understanding of the true minimal of the wafer.

Similar to the other configurations as shown in FIGS. 3A, 3B, 4A, and 4B, a second set of sensors may be placed beneath the wafer to collect additional measurement data that may be utilized to determine the thickness of a wafer. In an example, in FIG. 5A, a second set of sensors 510 may be placed beneath wafer 502 in order to determine the thickness of wafer 502.

Similarly, a second set of sensors 554 may be placed beneath the wafer shown in FIG. 5B to determine the thickness of the wafer. However, the thickness of the wafer may also be determined without the additional second set of sensors by extrapolating the thickness from historical measurement data gathered from other wafers.

Figure 7A:
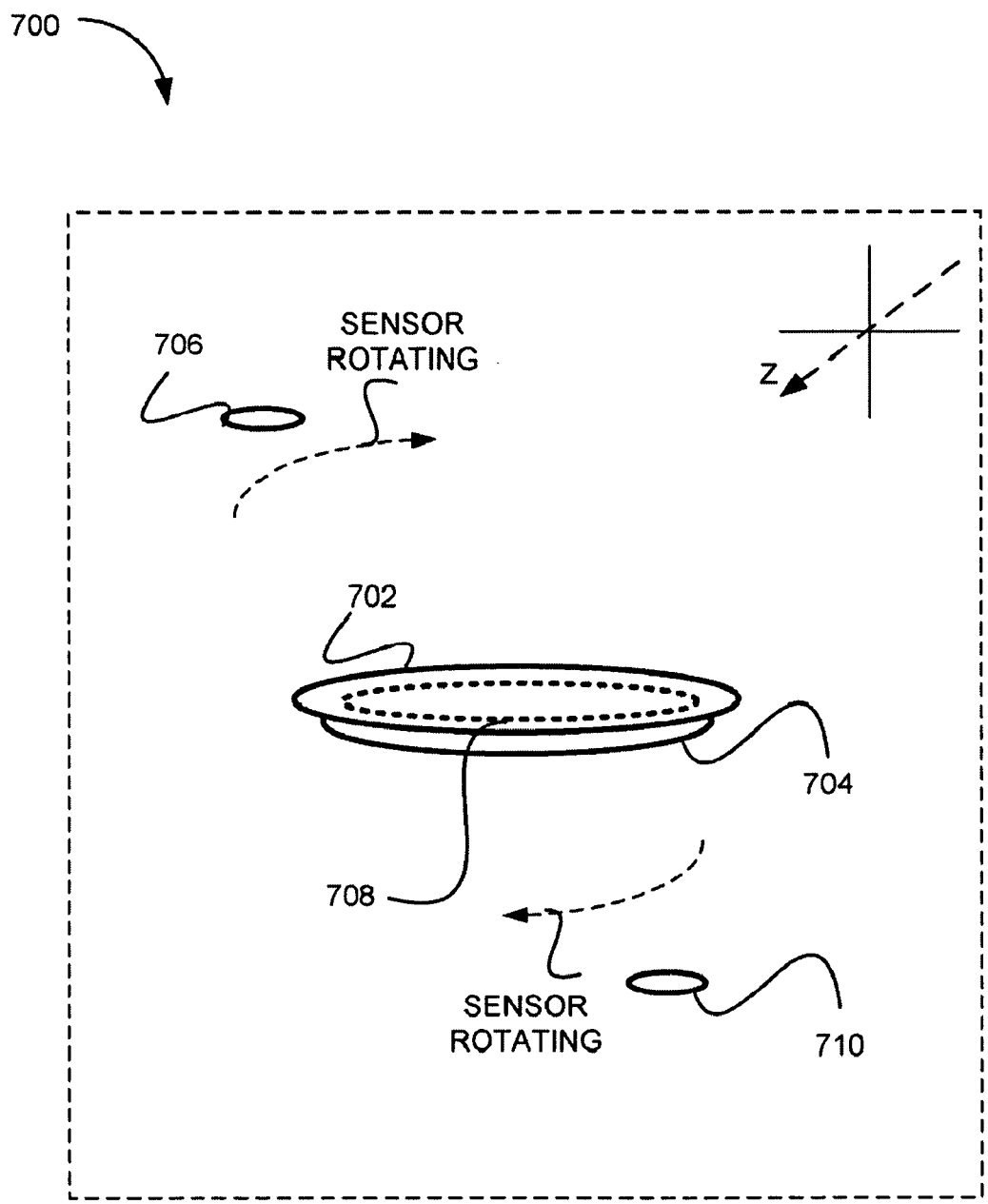
FIG. 7A shows, in an embodiment of the invention, a wafer bow metrology arrangement with a rotating sensor and a wafer that is stationary.

FIG. 7A shows, in an embodiment of the invention, a wafer bow metrology arrangement 700 with a rotating sensor and a wafer that is stationary. Consider the situation wherein, for example, a wafer 702 is positioned within an aligner on top of an electrostatic chuck 704. While sensor 706 is rotating, a plurality of measurements may be taken in a circular direction (708). Again, due to the potential wobbliness that the aligner may experience while the aligner is rotating, the first order of bow may actually be a reflection of the wobble effect on the aligner. Thus, a sinusoidal curve may actually be an indication that the wafer is planar. However, if the wafer is not perfectly planar, a perturbation (e.g., bump) may appear on the sinusoidal curve. In an embodiment, a second sensor 710 may be placed beneath wafer 702 in order to determine the thickness of wafer 702. As aforementioned, sensor 710 may have to obtain measurements at least along one of the same locations that sensor 706 may have measured.

Figure 7B:
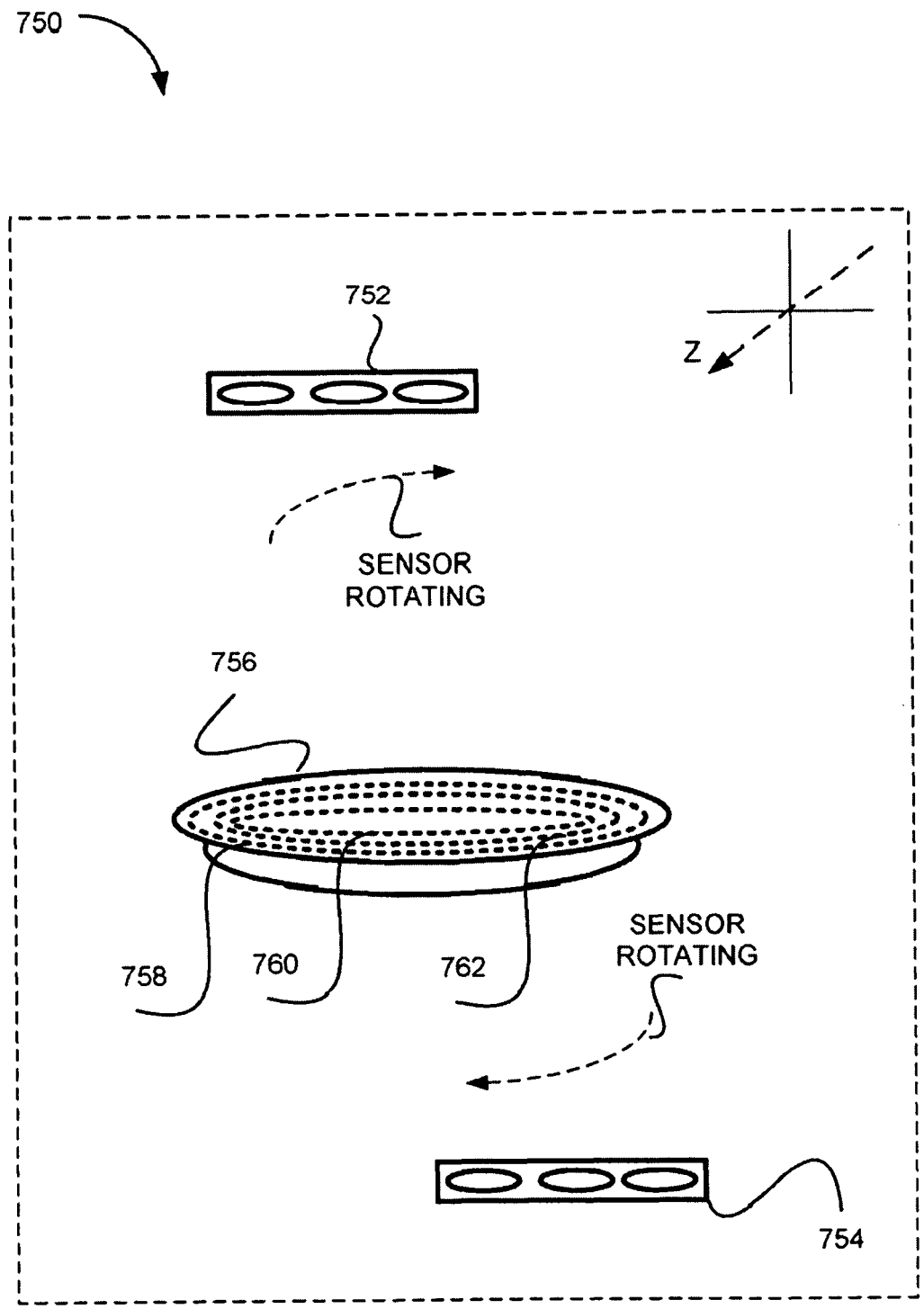
FIG. 7B shows, in an embodiment of the invention, a wafer bow metrology arrangement with an array of rotating sensors and a wafer that is stationary.

FIG. 7B shows, in an embodiment of the invention, a wafer how metrology arrangement 750 with an array of rotating sensors and a wafer 756 that is stationary. Wafer bow metrology arrangement 750 is similar to wafer bow metrology arrangement 700 in that measurements along a plurality of points may be taken in a circular direction. However, by having an array of sensors 752, measurements along more than one circumference (such as circumferences 758, 760, and 762) may, be taken.

In an embodiment a second sensor 754 may be placed beneath the wafer in order to determine the thickness of the wafer. However, the thickness of the wafer may also be determined without the additional second set of sensors by extrapolating the thickness from historical measurement data gathered from other wafers.

Figure 8:
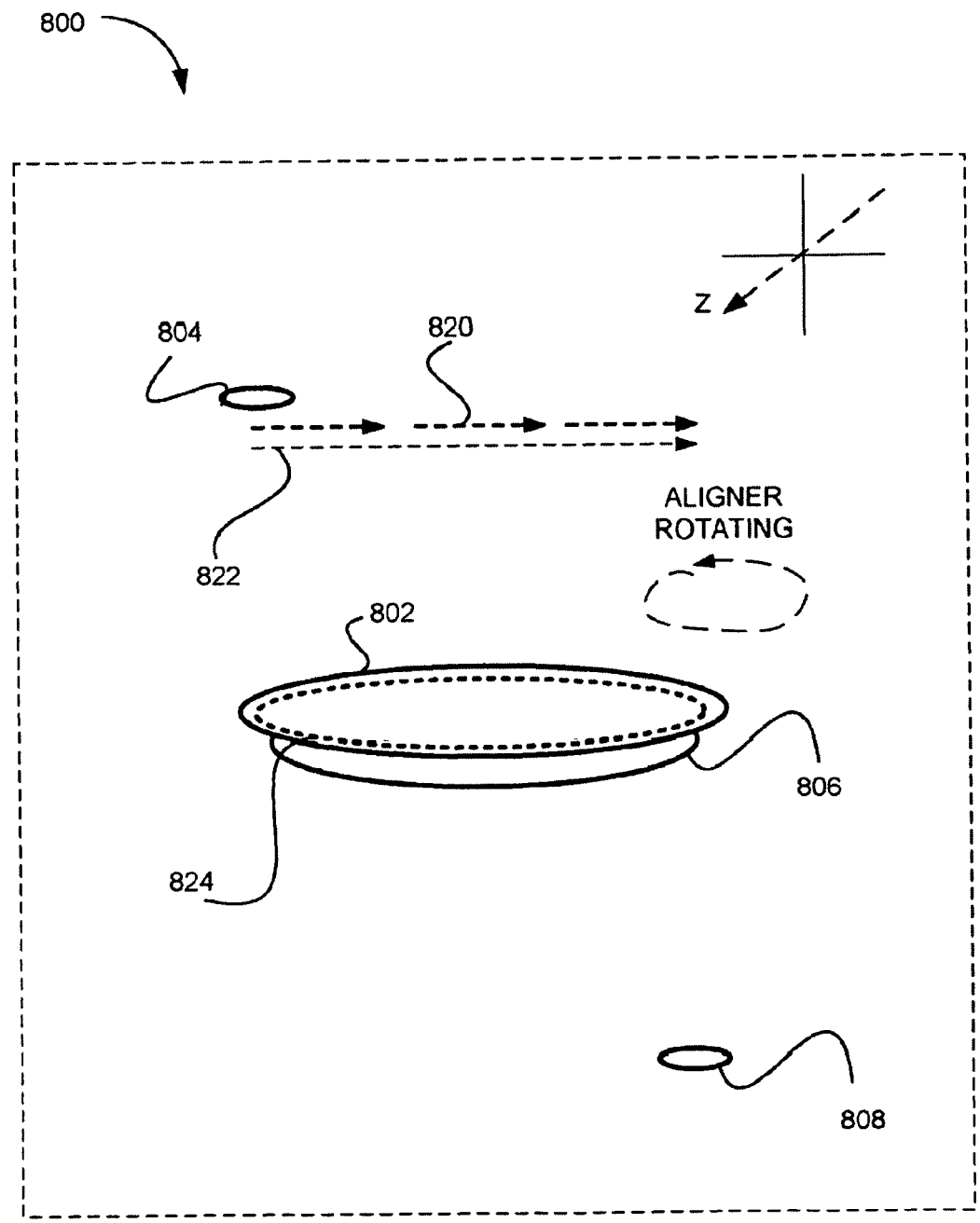
FIG. 8 shows, in an embodiment of the invention, a simple diagram of a water bow metrology arrangement in which a wafer is rotating while a set of sensors is moving.

FIG. 8 shows, in an embodiment of the invention, a simple diagram of a wafer bow metrology arrangement 800 in which a wafer 802 is rotating while a set of sensors 804 is moving. As wafer 802 is rotating, set of sensors 804 may be moving in a halting manner (820) or in a continuous motion (822). Consider the situation wherein, for example, wafer 802 that is positioned within an aligner on top of an electrostatic chuck 806 is rotating. While the set of sensors 804 is moving, a plurality of measurements may be taken in a circular direction (824). Similar to FIGS. 5A, 5B, 7A, and 7B, the first order of bow may reflect the wobbliness of the aligner. Thus, a sinusoidal curve without a perturbation may actually be showing a planar wafer. In addition, wafer thickness may be determined by positioning a second sensor 808 below the wafer.

Figure 9:
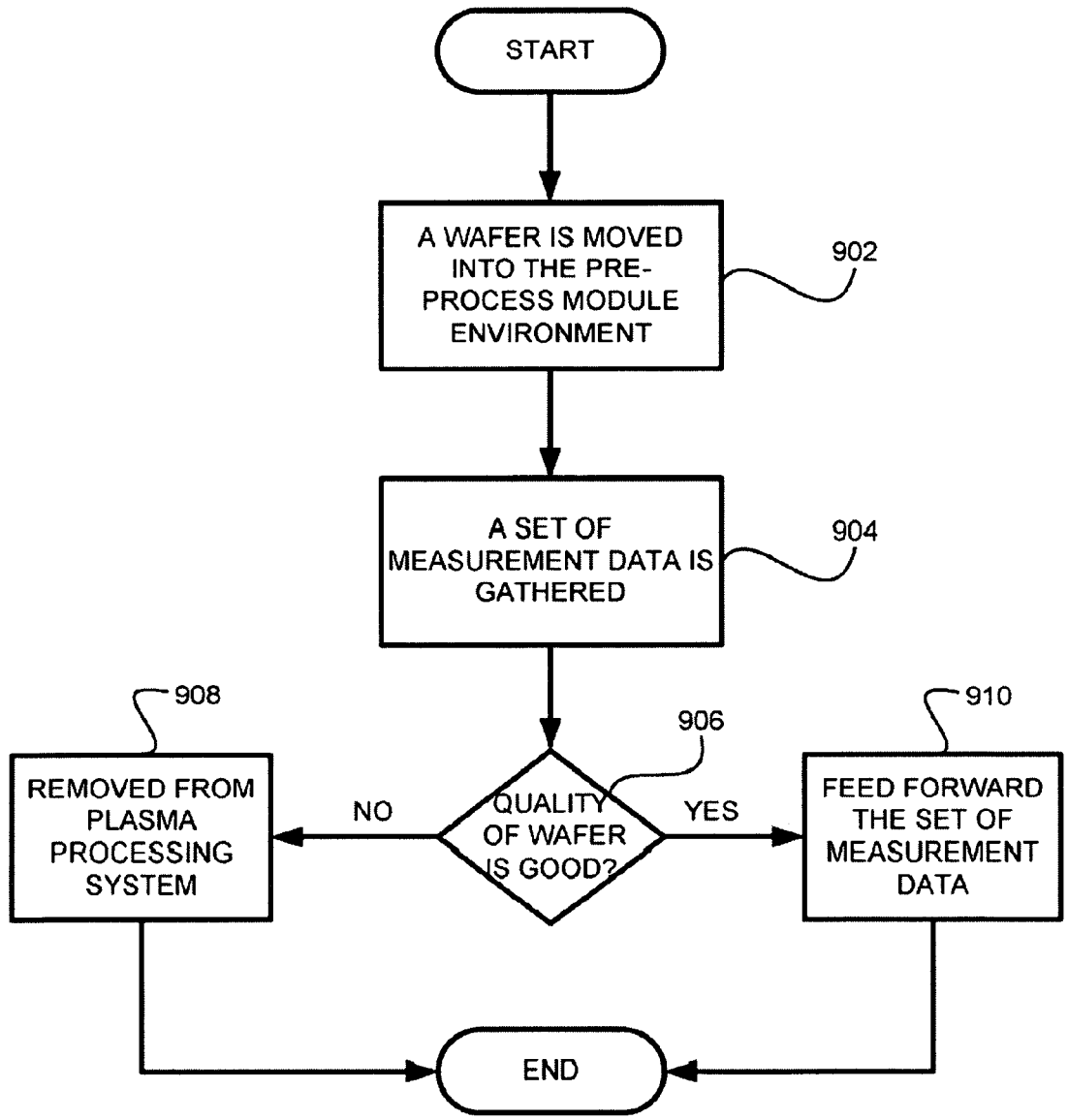
FIG. 9 shows, in an embodiment of the invention, a simple flow chart illustrating a method for employing a wafer bow arrangement.

FIG. 9 shows, in an embodiment of the invention, a simple flow chart illustrating a method for employing a wafer bow arrangement. Consider the situation wherein, for example, a batch of wafers is located on a FOUP.

At a first step 902, a wafer is moved from the FOUP into a pre-process module environment. In an example, a wafer from the batch of wafers ma, be transferred by a robotic arm located within an atmospheric transfer module from the FOUP through the ATM to an aligner. After the wafer is aligned, the wafer is moved through one of the airlock modules into the VTM. From the VTM, the wafer is moved into one of the process modules.

At a next step 904, a set of measurement data is gathered. As the wafer is moved through the pre-process module environment, a set of sensors, which may be strategically placed outside of the process module, is employed to measure a set of data points on the wafer. In an embodiment, measurement is performed automatically (without human intervention).

As aforementioned in FIG. 2, the location of the set of sensors may vary depending upon manufacturer's discretion. In an example, the set of sensors may be located at the entrance of the ATM. In another example, the set of sensors may be positioned within the aligner. As can be appreciated from the foregoing, the positioning of the set of sensors outside of the process modules enable measurements to be taken without negatively impacting processing time.

In another embodiment, a second set of sensors may be positioned opposite of the first set of sensors. Those skilled in the art are aware that a wafer thickness may differ. Since the thickness of the wafer may impact processing, being able to determine the thickness of the wafer may provide a technician with data for handling the wafer. In an example, a recipe ma, be designed to etch a standard wafer of 0.77 millimeter thick. If the wafer has a thickness of 0.55 millimeter, the recipe may be adjusted to account for the thickness difference. In an embodiment, if the wafer thickness is not within a pre-determined range, the technician ma) remove the "bad" wafer, thereby minimizing precious processing time in processing "bad" wafer that may result in substandard devices.

At a next step 906, a determination is made about the quality of the wafer. If the wafer is determined to be a substandard wafer (based on pre-determined standard), the wafer is removed from processing, at a next step 908. However, if the wafer is considered to be a "good" wafer, the set of measurement data associated with the wafer may be fed into the recipe. In an embodiment, the set of measurement data may be employed to adjust the recipe as needed, thereby accounting for the wafer configuration during processing (step 910).

As can be appreciated from the forgoing, one or more embodiments of the present invention provide for a wafer bow metrology arrangement for measuring wafer bows without unduly adding to the total process time. By performing in-line metrology in locations outside of process modules, parallel processing may occur while the extent of a wafer bow is being determined. Thus, less time and resources may be expended, thereby decreasing manufacturing cost of producing semiconductor devices While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An arrangement to quantify a wafer bow of a wafer, said arrangement being positioned within a plasma processing system that includes a set of process modules, the arrangement comprising:
   a support mechanism being configured to hold said wafer; and
   a first set of sensors being configured to collect a first set of measurement data of a plurality of data points on said wafer that quantify said wafer bow of said wafer, said first set of sensors being positioned in a first location, said first location being outside of said set of process modules of said plasma processing system.

2. The arrangement of claim 1 wherein said support mechanism is one of
   a robotic arm, and
   an electrostatic chuck.

3. The arrangement of claim 1 wherein said location of said first set of sensors is positioned at one of
   between a front opening unified pod (FOUP) and an atmospheric transfer module (ATM),
   between said ATM and an aligner,
   within said aligner,
   between said ATM and an airlock module,
   between said airlock module and a vacuum transfer module (VTM), and
   within said VTM.

4. The arrangement of claim 1 wherein said first set of sensors is a single sensor.

5. The arrangement of claim 1 wherein said first set of sensors include having a plurality of sensors.

6. The arrangement of claim 1 wherein said wafer is moving in a first direction while said first set of sensors is stationary, wherein said first direction includes one of a linear z direction and a rotating direction.

7. The arrangement of claim 1 wherein said first set of sensors is moving in a first direction while said wafer is stationary, wherein said first direction includes one of a linear z direction and a rotating direction.

8. The arrangement of claim 1 wherein said wafer is rotating while said first set of sensors is moving in a linear z direction.

9. The arrangement of claim 1 wherein said first set of sensors is collecting said first set of measurement data when another wafer is being processed in a process module of said set of process modules.

10. The arrangement of claim 1 further includes a second set of sensors,
    said second set of sensors being configured to collect a second set of measurement data, wherein said second set of measurement data include a measurement datum that corresponds to at least one date point of at least said plurality of data points measured by said first set of sensors, and said second set of sensors being positioned in a second location within said plasma processing system, said second location being opposite of said first position, wherein a gap exists between said first set of sensors and said second set of sensors, thereby enabling said wafer to be positioned between said first set of sensors and said second set of sensors.

11. The arrangement of claim 10 wherein said second set of sensors is directly parallel to said first set of sensors.

12. The arrangement of claim 11 wherein a wafer thickness of said wafer is determined by comparing said first set of measurement data to said second set of measurement data.

13. An arrangement to quantify a bow of a substrate, said arrangement being positioned within a plasma processing system that includes a set of process modules, the arrangement comprising:
  means for supporting said substrate while said substrate is within said plasma processing system; and
  means for collecting a first set of measurement data for a plurality of data points on said substrate, said first set of measurement data quantifying said bow of said substrate, said means for collecting said first set of measurement data being positioned at a first location, wherein said first location is outside of said set of process modules of said plasma processing system.

14. The arrangement of claim 13 wherein said means for supporting said substrate is one of
  a robotic arm, and
  an electrostatic chuck.

15. The arrangement of claim 13, wherein said means for collecting a first set of measurement data is a set of sensors, wherein said set of sensors being one of a set of contact sensors, a set of capacitive sensors, a set of inductive sensors, a set of laser sensors, a set of ultra sonic sensors, a set of reflective sensors, and a set of through beam sensors.

16. The arrangement of claim 15 wherein said set of sensors is positioned at one of
  between a front opening unified pod (FOUP) and an atmospheric transfer module (ATM),
  between said ATM and an aligner,
  within said aligner,
  between said ATM and an airlock module,
  between said airlock module and a vacuum transfer module (VTM), and
  within said VTM.

17. The arrangement of claim 15 wherein said substrate is moving in a first direction while said set of sensors is stationary, wherein said first direction includes one of a linear z direction and a rotating direction.

18. The arrangement of claim 15 wherein said set of sensors is moving in a first direction while said substrate is stationary, wherein said first direction includes one of a linear z direction and a rotating direction.

19. The arrangement of claim 15 wherein said substrate is rotating while said set of sensors is moving in a linear z direction.

20. The arrangement of claim 13 further includes means for collecting a second set of measurement data, wherein
  said second set of measurement data includes a measurement datum that corresponds to at least one data point of at least said plurality of data points measured by said means for collecting a first set of measurement data, and
  said means for collecting a second set of measurement data being positioned at a second position, wherein said second position being opposite of said first position, wherein a gap exists between said first position and said second position such that said substrate is position between said first position and said second position.

* * * * *